US008846145B2

(12) United States Patent
Kinoshita

(10) Patent No.: US 8,846,145 B2
(45) Date of Patent: Sep. 30, 2014

(54) LIQUID PROCESSING METHOD

(71) Applicant: Tokyo Electron Limited, Tokyo (JP)

(72) Inventor: Michio Kinoshita, Kumamoto (JP)

(73) Assignee: Tokyo Electron Limited, Tokyo (JP)

(*) Notice: Subject to any disclaimer, the term of this patent is extended or adjusted under 35 U.S.C. 154(b) by 25 days.

(21) Appl. No.: 13/656,861

(22) Filed: Oct. 22, 2012

(65) Prior Publication Data

US 2013/0040062 A1 Feb. 14, 2013

Related U.S. Application Data

(62) Division of application No. 12/582,860, filed on Oct. 21, 2009, now Pat. No. 8,316,795.

(30) Foreign Application Priority Data

Oct. 21, 2008 (JP) ................................ 2008-270431

(51) Int. Cl.
*B05D 3/12* (2006.01)
*G03F 7/16* (2006.01)
*B05B 15/02* (2006.01)
*B05B 12/08* (2006.01)
*G03F 7/30* (2006.01)
*H01L 21/67* (2006.01)
*B05B 1/14* (2006.01)

(52) U.S. Cl.
CPC ............ *H01L 21/6715* (2013.01); *G03F 7/162* (2013.01); *B05B 1/14* (2013.01); *B05B 15/0275* (2013.01); *B05B 12/08* (2013.01); *G03F 7/3021* (2013.01)
USPC ............. 427/240; 427/425; 118/52; 118/320; 438/780; 438/782

(58) Field of Classification Search
CPC .... B05B 12/08; B05B 15/02; B05B 15/0275; B05B 1/14; H01L 21/6715; H01L 21/027; G03F 7/162
USPC ............. 427/240, 425; 118/52, 320; 438/780, 438/782
See application file for complete search history.

(56) References Cited

U.S. PATENT DOCUMENTS 6,878,401 B2 * 4/2005 Nishijima et al. ............ 427/240
2006/0233952 A1 10/2006 Nakashima et al.
(Continued)

FOREIGN PATENT DOCUMENTS

JP 09-145453 A 6/1997
JP 2003-136015 A 5/2003
(Continued)

OTHER PUBLICATIONS

Japanese Office action for 2008-270431 dated Dec. 28, 2010.

*Primary Examiner* — Kristen Jolley
(74) *Attorney, Agent, or Firm* — Pearne & Gordon LLP

(57) ABSTRACT

A liquid processing method forms a coating film by supplying and pouring a coating solution from a coating solution nozzle onto a surface of a substrate held substantially horizontally by a substrate holder. In the liquid processing method, a process for photographing a leading end portion of a coating solution nozzle is provided. When performing a process for anti-drying of the coating solution for a long period of time in advance, a position of the coating solution and a position of an anti-drying liquid are set by using a soft scale displayed on a screen where the photographed image is displayed. Therefore, a dispense control is performed based on a set value without depending on the naked eyes and a control for suppressing the drying of the coating solution in the leading end portion of the coating solution nozzle is performed.

3 Claims, 14 Drawing Sheets

(56) References Cited

U.S. PATENT DOCUMENTS

2008/0100809 A1  5/2008  Nakashima et al.
2010/0051059 A1* 3/2010  Kometani et al. ............... 134/21

FOREIGN PATENT DOCUMENTS

| JP | 2003-177411 A | 6/2003 |
|----|---------------|--------|
| JP | 2006-302934 A | 11/2006 |

* cited by examiner

COATING UNIT

NOZZLE TRANSFER MECHANISM

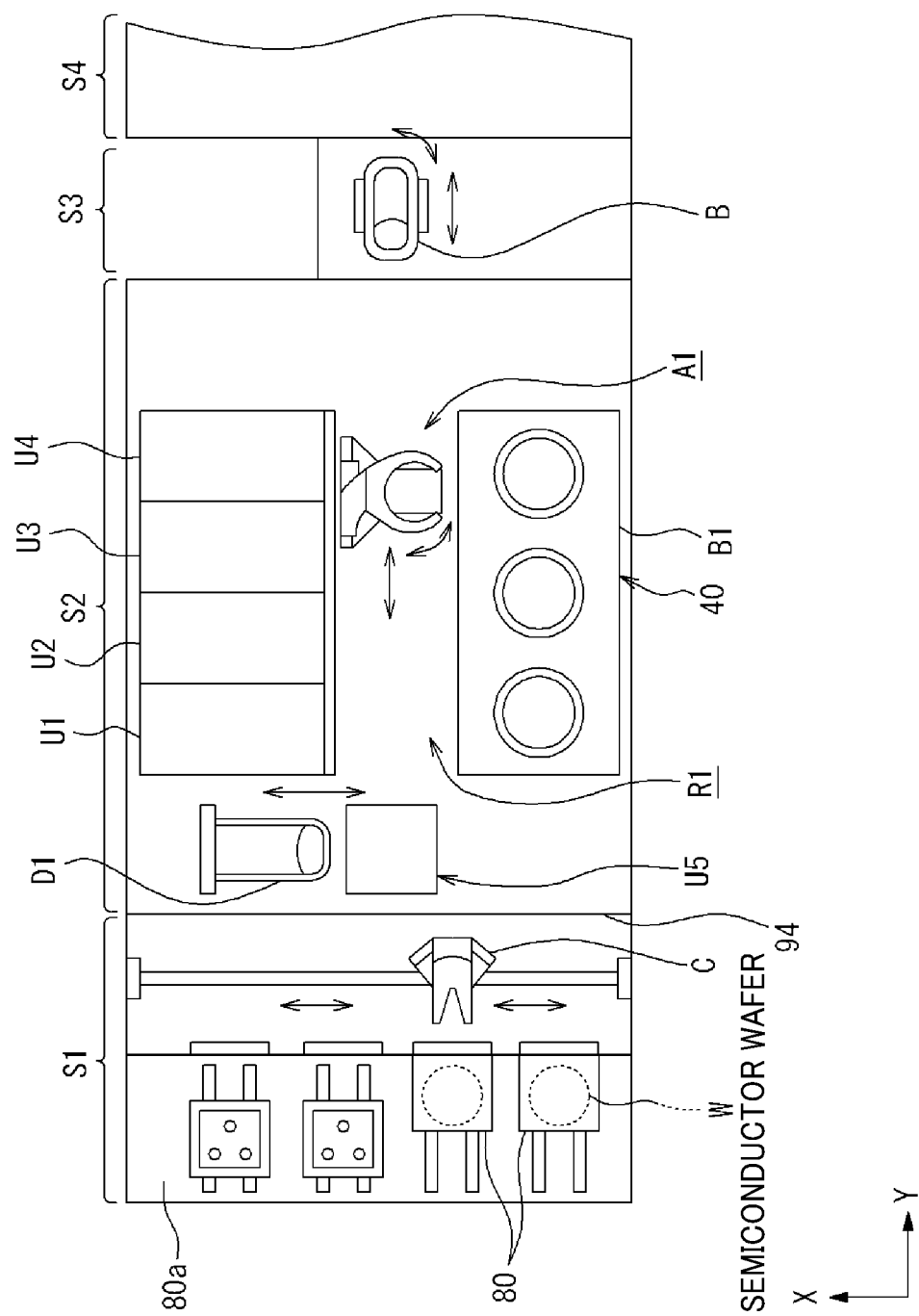

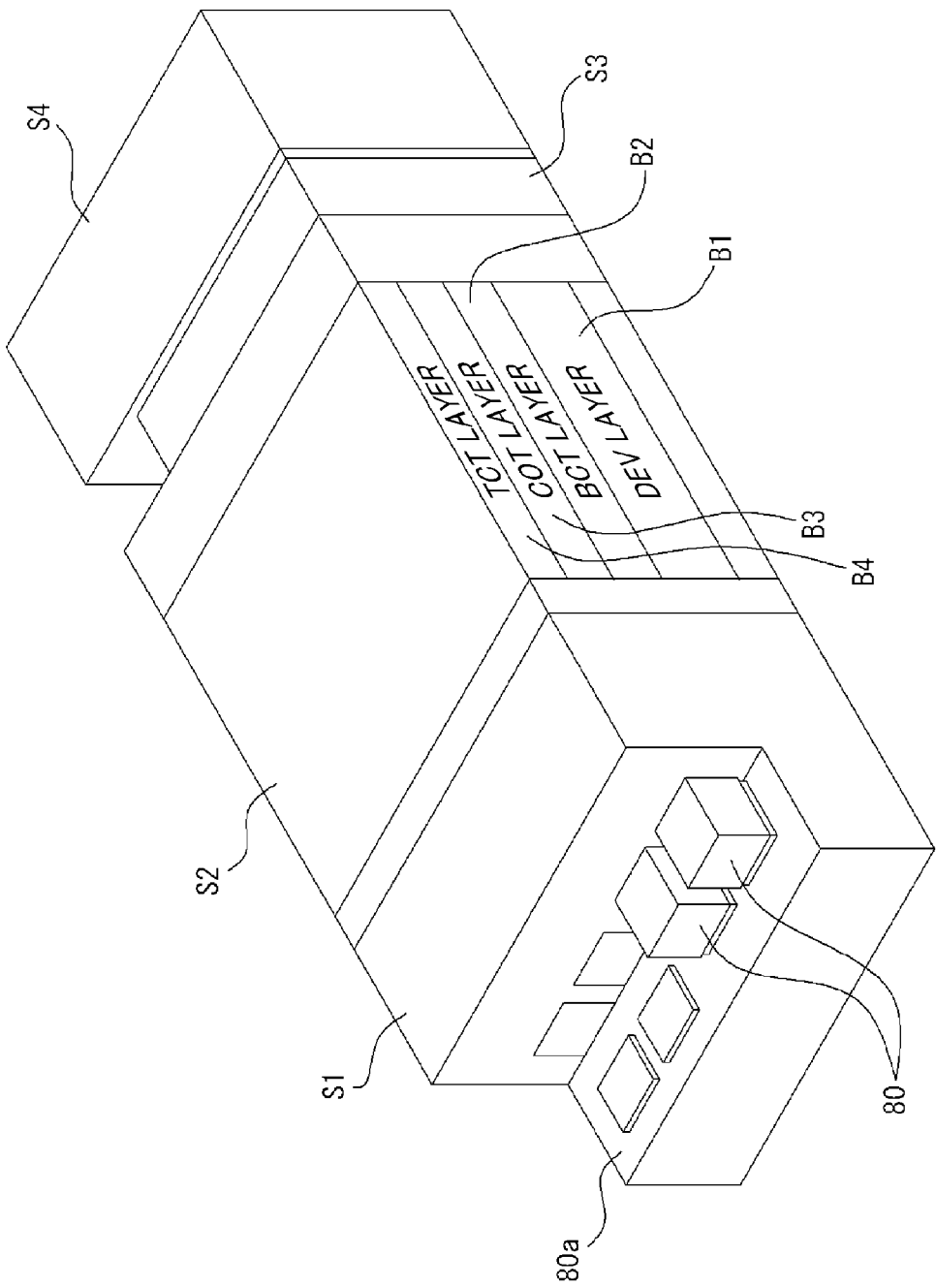

LIQUID PROCESSING METHOD

CROSS-REFERENCE TO RELATED APPLICATION

This is a divisional application of U.S. patent application Ser. No. 12/582,860 filed on Oct. 21, 2009, which claims the priority from Japanese Patent Application No. 2008-270431 filed on Oct. 21, 2008, the entire disclosure of which are incorporated herein by reference.

FIELD OF THE INVENTION

The present disclosure relates to a liquid processing apparatus and a liquid processing method.

BACKGROUND OF THE INVENTION

Generally, a process of forming a resist pattern on a substrate, which is one of manufacturing processes of a semiconductor device or a FPD substrate, is performed by a series of processes of forming a resist film on the substrate, e.g., a semiconductor wafer (hereinafter, referred to as a "wafer"); exposing the resist film through a photomask; and developing the exposed resist film so as to obtain a desired pattern. Conventionally, the series of processes have been performed by a coating and developing apparatus.

In a coating unit for applying, for example, a resist solution serving as a coating solution to a wafer, a cup body is provided so as to surround a spin chuck, which is a substrate holding unit, and processes such as spin coating of the resist solution, spin drying and side-rinse are performed by supplying the resist solution onto a substantially central position of a wafer held on the spin chuck and rotating the spin chuck.

The supply of the resist solution onto the wafer is carried out by pouring the resist solution supplied from a supply unit through a nozzle (coating solution nozzle). Further, the nozzle may be usually in a standby state at a position away from a wafer loading/unloading path so as not to obstruct a loading/unloading operation of the wafer, and only when the resist solution is poured, the nozzle is moved to the center of the wafer held on the spin chuck.

In the coating unit, plural kinds of resist solutions have been used depending on the kind of a base film on which the resist film is formed or a thickness of the resist film. A coating nozzle is provided for each kind of resist solution, and is configured to be moved by a common driving arm between a standby position and a processing position where the coating process of the resist solution is performed. With this configuration, since a coating nozzle needs to be replaced by the driving arm, there is required many operation processes. Further, since a discharge (pouring) position of each nozzle with respect to the substrate needs to be adjusted individually by the driving arm, the process becomes troublesome.

In this regard, there has been known a resist coating apparatus having a configuration in which a plurality of coating units is juxtaposed in a row and coating nozzles are integrated as one body on a common driving arm movable between the plurality of the coating units juxtaposed in the row (see, for example, Patent Document 1).

Conventionally, leading ends of the plurality of coating solution nozzles are in a standby state after performing a suck-back of the resist solution so as to suppress contamination or dryness at an interface between the resist and the atmospheric atmosphere. With respect to the plurality of coating solution nozzles, it is desirable to check a nozzle state of each of coating solution nozzles moved by the driving arm even when they are not used in the coating process, and since these nozzles are moved as one body, there is a need to reduce, for example, a risk of drip of the liquid or a risk of dryness of the liquid. In this regard, it is suggested in Patent Document 1 that an air layer, formed by sealing the leading end of the coating solution nozzle with a liquid, prevents the resist solution from being dried.

With this configuration, conventionally, a dummy dispense of the resist solutions having different dryness levels depending on the kind of the resist solutions or liquids contained therein is set for each resist solution according to the property of each resist. However, by sealing the leading end of the coating solution nozzle with the liquid in the same manner, the resist of the coating solution nozzle is prevented from directly contacting with the external atmosphere, and since the risk of dryness of the coating solution nozzle is reduced, there is no need to perform the dummy dispense for a long time.

Patent Document 1: Japanese Patent Laid-open Publication No. 2006-302934 (see, FIGS. 3, 4 and 8)

BRIEF SUMMARY OF THE INVENTION

The present disclosure provides an apparatus and a method for performing a liquid suction operation such that an inside of a non-used coating solution nozzle is filled with a predetermined resist solution, a sealing air layer and a liquid layer in sequence depending on the property of the resist (the kind or viscosity of the resist), whereby it is not necessary to perform a dummy dispense for a long time which is determined by an amount of a sucked liquid layer (standby state for a long time); and setting a suck-back operation for each of a plurality of nozzles with a precise amount in a short time so as to prevent a process failure caused by drip of the leaked liquid.

In accordance with one aspect of the present disclosure, there is provided a liquid processing apparatus that forms a coating film by supplying and pouring a coating solution from a coating solution nozzle onto a surface of a substrate held substantially horizontally by a substrate holder, the apparatus including: a nozzle transfer mechanism configured to move the coating solution nozzle above the substrate held by the substrate holder; a nozzle bath configured to keep the coating solution nozzle at a standby position; a dispense controller that controls, in the nozzle bath, a pouring operation of the coating solution from the coating solution nozzle, a suction operation of the coating solution and an anti-drying liquid for the coating solution, and a discharge operation of the anti-drying liquid; a controller that controls the dispense controller; a determination processing unit that is provided in the controller, and analyzes and checks image data of the coating solution nozzle photographed by an imaging unit; a display unit for displaying the photographed image data of the coating solution nozzle and inputting a setting value; and a soft scale having graduations which are displayed in the display unit to be overlapped with the image data of the coating solution nozzle photographed by the imaging unit in a vertical direction, wherein the determination processing unit makes a determination by comparing the setting value set by the graduations of the soft scale with suction positions of the coating solution and the anti-drying liquid in the coating solution nozzle with reference to the photographed image data of the coating solution nozzle operated by the controller, such that the coating solution and the anti-drying liquid in the coating solution nozzle are positioned at an optimum position on the display unit, and the controller controls the dispense controller based on the determination to perform an anti-drying adjustment of the coating solution in a leading end portion of the coating solution nozzle.

In accordance with another aspect of the present disclosure, there is provided a liquid processing method that forms a coating film by supplying and pouring a coating solution from a coating solution nozzle onto a surface of a substrate held substantially horizontally by a substrate holder, the method including: moving the coating solution nozzle to a nozzle bath for keeping the coating solution nozzle in a standby state; controlling a dispense process including a pouring operation of the coating solution from the coating solution nozzle, a suction operation of the coating solution and an anti-drying liquid for the coating solution, and a discharge operation of the anti-drying liquid; analyzing and checking image data of the coating solution nozzle photographed by an imaging unit; and displaying the image data of the coating solution nozzle on a soft scale having graduations which are displayed to be overlapped with the image data of the coating solution nozzle photographed by the imaging unit in a vertical direction, and inputting a setting value, wherein, analyzing and checking the image data includes: making a determination by comparing the setting value set by the graduations of the soft scale in displaying the image data with suction positions of the coating solution and the anti-drying liquid in the coating solution nozzle with reference to the photographed image data of the coating solution nozzle under operation, such that the coating solution and the anti-drying liquid in the coating solution nozzle are positioned at an optimum position, and the dispense process is controlled based on a result of analyzing and checking the image data to perform an anti-drying adjustment of the coating solution in a leading end portion of the coating solution nozzle.

BRIEF DESCRIPTION OF THE DRAWINGS

The disclosure may best be understood by reference to the following description taken in conjunction with the following figures:

FIG. 10 is a plane view of an embodiment of a coating and developing apparatus to which the coating unit is applied;

FIG. 11 is a perspective view of the coating and developing apparatus; and

DETAILED DESCRIPTION OF THE INVENTION

Figure 1A:
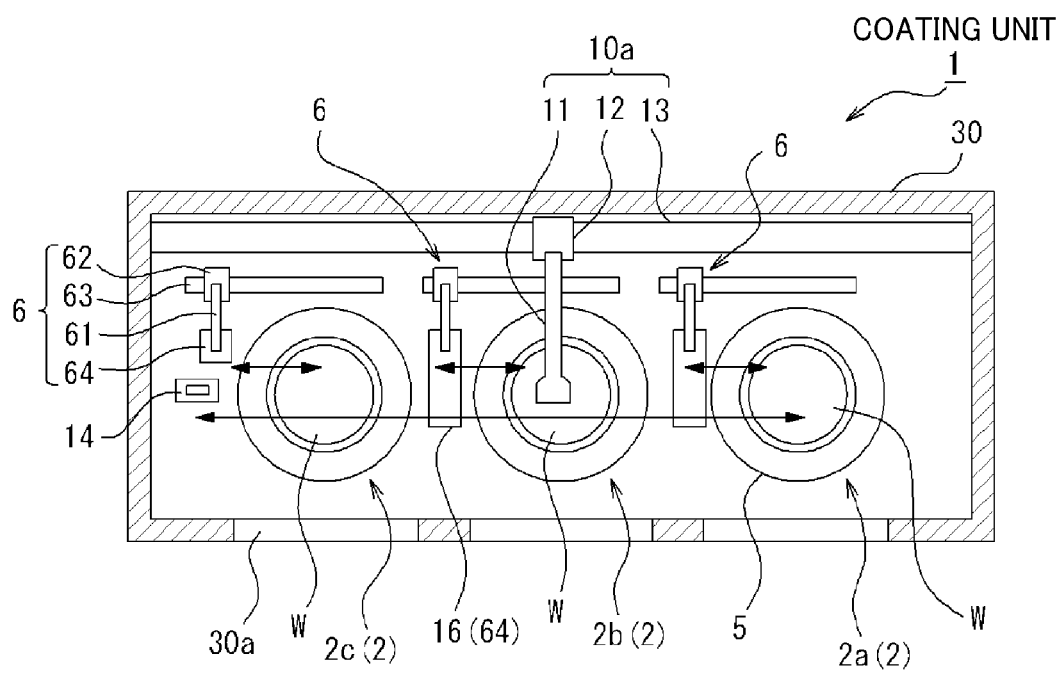
FIG. 1A provides a plane view of a coating unit in accordance with the present disclosure.
Figure 1B:
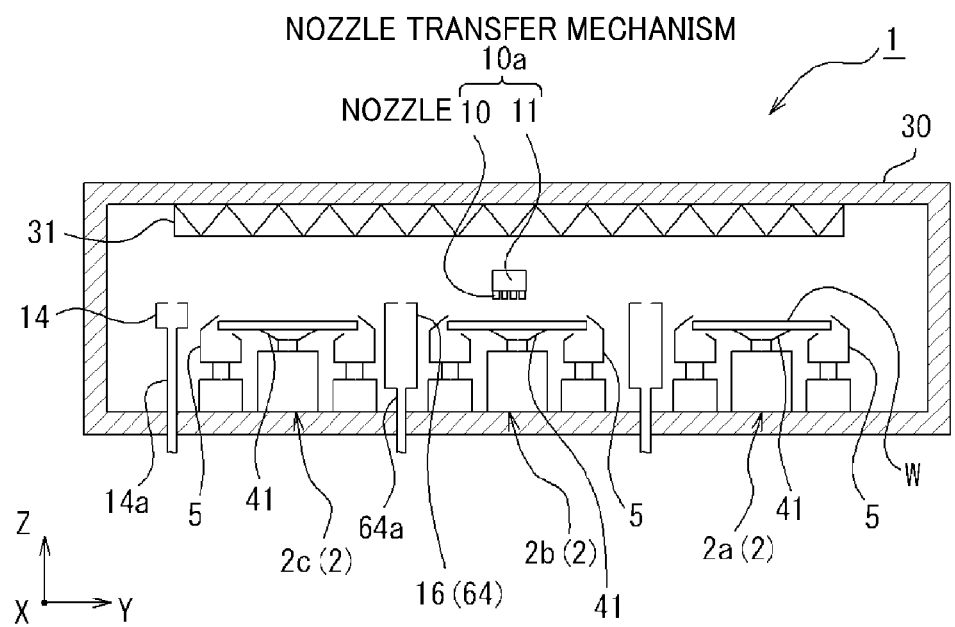
FIG. 1B is a longitudinal cross-sectional view of the coating unit.
Figure 2:
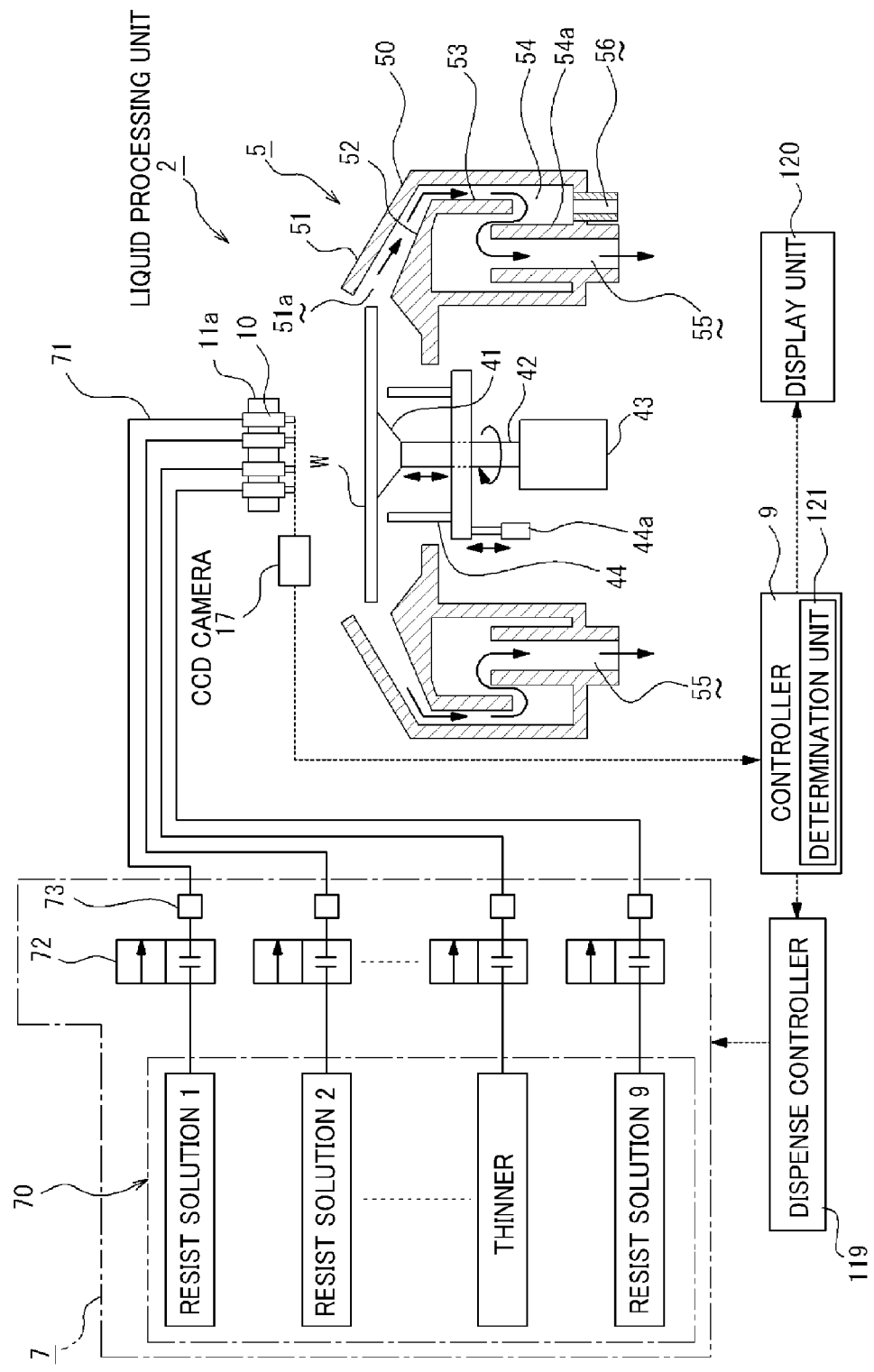
FIG. 2 is a configuration view of a liquid processing unit in the coating unit and a supply unit for supplying a coating solution.

Hereinafter, embodiments of the present disclosure will be described with reference to the accompanying drawings. Herein, there will be described an embodiment in which a liquid processing apparatus in accordance with an embodiment of the present disclosure is applied to a coating unit for coating a wafer with a resist solution. A schematic configuration of the coating unit in accordance with the present embodiment will be first described. FIG. 1A is a schematic plane view of a coating unit 1, and FIG. 1B is a longitudinal cross-sectional view thereof. Further, FIG. 2 is a configuration view showing a relationship between a liquid processing unit 2 within the coating unit 1 and a supply unit 7 for supplying a coating solution to the liquid processing unit 2.

As illustrated in FIGS. 1A and 1B, the coating unit 1 in accordance with the present embodiment includes, in a flat box-shaped case 30, three liquid processing units 2a, 2b and 2c arranged in a row in a horizontal direction (Y-axis direction of the drawing), a plurality of nozzles 10 for supplying a coating solution such as a resist solution or thinner to these liquid processing units 2a, 2b and 2c, a nozzle transfer mechanism 10a for moving these nozzles 10, a nozzle bath 14 where the nozzles 10 are on standby, and edge bead remover (EBR) mechanisms 6 for removing a peripheral portion of a resist film coated on a wafer W.

The liquid processing units 2 (2a, 2b and 2c) have a common structure including a spin chuck 41 serving as a substrate holder and a cup body 5 provided to surround the wafer W held by the spin chuck 41. Below, the configuration of the liquid processing unit 2 will be described.

The spin chuck 41 serves as the substrate holder for holding the wafer W horizontally by attracting and holding a central portion of a rear surface of the wafer W. As depicted in FIG. 2, the spin chuck 41 is connected with a driving mechanism (spin chuck motor) 43 via a shaft 42 and can be rotated and elevated while holding the wafer W horizontally. Provided at a lateral side of the spin chuck is an elevating pin 44 which is connected with an elevating mechanism 44a to be movable up and down while supporting the rear surface of the wafer W thereon, and the elevating pin 44 can carry out a transfer of the wafer W loaded from the outside of the case 30 in cooperation with a transfer unit (transfer arm A3) to be described below. Further, a reference numeral 30a in FIG. 1A denotes a wafer loading/unloading port formed in a wall of the case 30, facing the transfer unit.

The cup body 5 serves to prevent a mist dispersed when the wafer W is rotated during spin coating from being scattered into the case 30 and discharge the mist to the outside of the coating unit 1. The cup body 5 has a substantially doughnut appearance and the inside thereof is configured as illustrated in FIG. 2.

The inside of the cup body 5 is configured such that a first ring member 51 and a second ring member 52 each formed in an inclined ring shape are provided in the inside of a doughnut-shaped cup main body 50 as illustrated in FIG. 2, and a gap between these ring members 51 and 52 serves as a gas path 51a through which a gas containing the mist dispersed from the wafer W flows. Further, the second ring member 52 is disposed below a peripheral portion of the wafer W held by the spin chuck 41 and its top surface is bent in an inverted V-shape. Provided at an outer end of the second ring member 52 is an end plate 53 extended downward so as to be put into a liquid sump 54 formed on a lower portion of the cup main body 50. With this configuration, some of the resist solution dispersed from the wafer W is guided to the liquid sump 54 along the surfaces of the second ring member 52 and the end plate 53.

The lower portion of the cup main body 50 serves as the liquid sump 54, and provided at its bottom portion are, for example, two exhaust ports 55 for exhausting a gas flowing through the inside of the cup body 5 and a drain port 56 for discharging the resist solution collected in the liquid sump 54. The exhaust port 55 is connected with a non-illustrated exhaust duct, and the exhaust duct connected with the exhaust port 55 of each liquid processing unit 2a (2b and 2c) is connected with an exhaust system outside the case 30.

In this case, as illustrated in FIG. 2, the exhaust port 55 is extended upward in the liquid sump 54 and there is provided an overflow prevention wall 54a for preventing an overflow from the liquid sump 54 to the exhaust port 55. Furthermore, the drain port 56 is also connected with a non-illustrated drain pipe to discharge the resist solution to the outside of the coating unit 1.

Furthermore, as illustrated in FIG. 1B, a filter unit 31 is provided at a ceiling portion, facing the cup body 5, of the case 30, and through the filter unit 31, e.g., a clean air is supplied at a predetermined flow rate, so that a down flow of the clean air is formed inside the case 30. Some of the clean air is exhausted through a non-illustrated exhaust unit provided in the case 30, and the rest is flown into the cup body 5 and air flows are formed and discharged through the exhaust port 55, as indicated by arrows in the cross-sectional view of the cup body 5 in FIG. 2.

Figure 3:
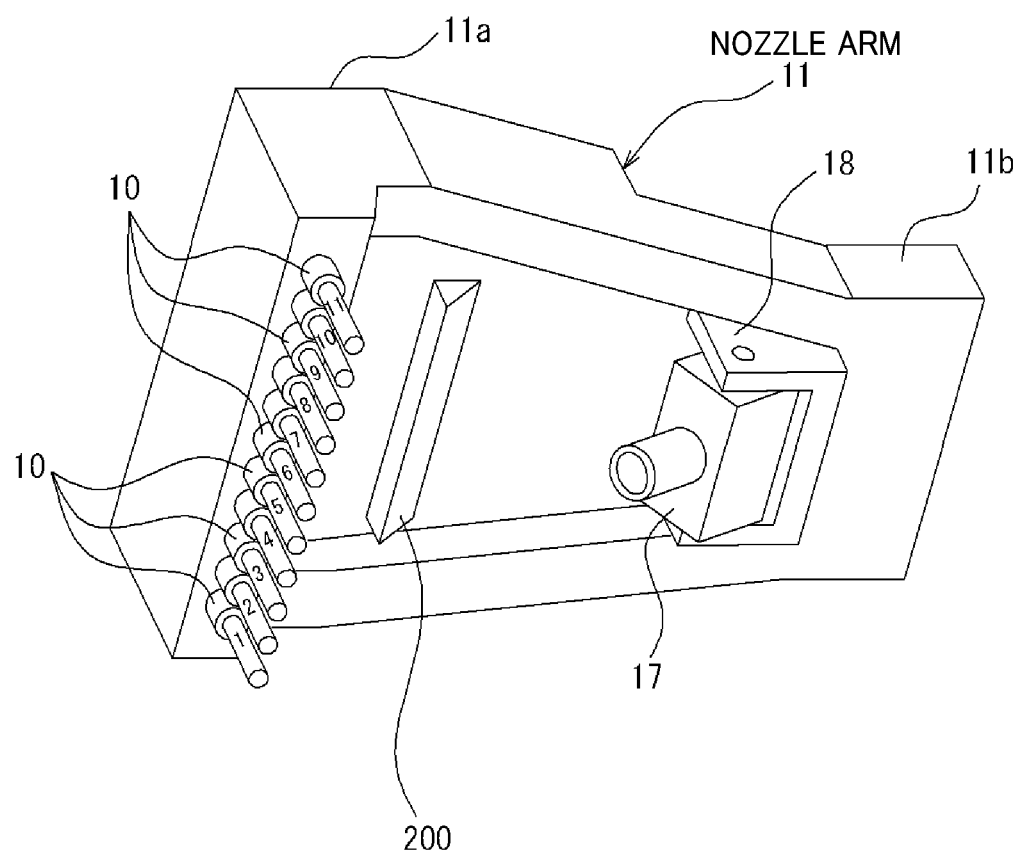
FIG. 3 is a perspective view showing a state where coating nozzles for supplying coating solutions are installed on a nozzle arm.

There will be described a configuration of the coating solution nozzle 10 (hereinafter, referred to as a nozzle 10) and its transfer mechanism. The nozzle 10 serves to supply the resist solution onto a surface of the wafer W held by the spin chuck 41. FIG. 3 is a perspective view showing a detailed structure of the nozzle 10 and a nozzle arm 11 holding the nozzle 10. The coating unit 1 in accordance with the present embodiment includes eleven nozzles 10 for supplying ten kinds of resist solutions having different concentrations or compositions and thinner that promotes a spread of the resist solutions on the wafer W (hereinafter, generically referred to as a coating solution). Furthermore, in FIGS. 1A and 2, some of the nozzles are omitted for simple illustration.

As illustrated in FIG. 1A, the nozzle transfer mechanism 10a includes the nozzle arm 11 holding the nozzles 10, a base 12 supporting the nozzle arm 11, a rail 13 along which the base 12 travels, and a mechanism (not illustrated) for moving the base 12 along the rail 13.

As illustrated in FIG. 3, the nozzle arm 11 includes a nozzle head 11a holding the eleven nozzles 10 and an arm 11b supporting the nozzle head 11a. A lower surface of a leading end portion of the nozzle head 11a is configured such that base parts of the nozzles 10 can be fitted thereinto, and the nozzles 10 can be held simply by inserting thereinto the base parts of the nozzles 10. As a result, the eleven nozzles 10 are arranged in a row with their leading end portions facing downward and arranged in a direction coincident with a moving direction of the nozzle 10 as illustrated in FIG. 1A. Meanwhile, a supply pipe 71 of the supply unit 7 to be described later is connected with a base part of the nozzle head 11a, so that the coating solution passes through the inside of the nozzle head 11a and is supplied to the nozzles 10.

The arm 11b is a supporting member provided between the nozzle head 11a and the base 12 to move the nozzles 10 above the substantially central position of the wafer W held by the spin chuck 41. The base 12 serves as a slider for moving the nozzle arm 11. The base 12 includes a non-illustrated elevating mechanism and a base part of the arm 11b is connected to the elevating mechanism. With this configuration, the nozzle arm 11 can be moved up and down freely in a Z-axis direction illustrated in FIG. 1B. Further, the rail 13 is installed on the lateral side of the liquid processing unit 2 and parallel to an arrangement direction of respective liquid processing units 2a, 2b and 2c. Here, the coating unit 1 includes the nozzle bath 14 on which the nozzles 10 are mounted to be in a standby state when the coating solution is not supplied. The rail 13 has a length sufficient to move the base 12 between the nozzle bath 14 and a position where the coating solution can be supplied to the wafer W held in the liquid processing unit 2a located farthest from the nozzle bath 14. Furthermore, an atmosphere of a thinner is created in the nozzle bath 14 such that the resist solution is not dried while the nozzles 10 are in a standby state.

Further, the mechanism for moving the base 12 has a structure including, for example, wrapping shafts (not shown) arranged along the rail 13, a transfer belt (not shown) wound around the wrapping shafts and fastened to the base 12, and a driving device (not shown) such as a motor connected to one of the wrapping shafts. By controlling a rotation direction and the number of rotations of the wrapping shaft, the base 12 can be moved to a desired position.

With this configuration, by moving the base 12 along the rail 13, the nozzles 10 arranged in a row can be moved along a straight line connecting the nozzle bath 14 and the substantially central positions of the liquid processing units 2a, 2b and 2c. Accordingly, when the wafer W is held in any one of the liquid processing units 2a, 2b and 2c, the nozzles 10 for supplying a desired coating solution can be moved above the substantially central position of the wafer W by controlling a stop position of the base 12, and the coating solution can be supplied to the wafer W at that position.

Hereinafter, the EBR mechanism 6 will be explained. The EBR mechanism 6 supplies rinse for removing the resist film to the peripheral portion of the wafer W so as to prevent the peripheral portion of the resist film coated on the wafer W from being peeled off. The respective EBR mechanisms 6 provided in the respective liquid processing units 2a, 2b and 2c have substantially the same structure. As illustrated in FIG. 1A, the EBR mechanism 6 includes an EBR arm 61 holding the nozzle for discharging the rinse, a base 62 for moving the EBR arm 61, a rail 63 along which the base 62 travels and an EBR nozzle bath 64 for holding the nozzle 10 in a standby state when the rinse is not supplied.

Hereinafter, a configuration of the supply unit 7 for supplying the coating solution to the nozzle 10 will be explained with reference to FIG. 2. The supply unit 7 includes coating solution supply mechanisms (coating solution supply units) 70 as many as the number of the kinds of the coating solutions. Each of the coating solution supply mechanisms 70 has a non-illustrated supply tank storing, for example, the coating solution and a non-illustrated pressurizing device for sending the coating solution stored in the supply tank to the coating unit 1 by using an electric pump or by pressurizing the inside of the supply tank by supplying a gas to the supply tank.

Each coating solution supply mechanism 70 is connected with each nozzle 10 through an air-operated valve serving as a flow rate controller for supplying or stopping supplying the coating solution, a suck-back valve 73 serving as a processing liquid sucking unit for sucking-back the coating solution from the leading end portion of the nozzle 10 when the coating solution is not supplied, and the supply pipe 71. With this configuration, the coating solution supply mechanisms 70 can selectively supply the ten kinds of resist solutions and the thinner. Further, in FIG. 2, the coating solution supply mechanism 70 for supplying the thinner is connected with the second nozzle 10 when viewed from the left in the drawing for the convenience of illustration, but it is actually connected with the sixth nozzle 10 when viewed from the left in the drawing as illustrated in FIG. 3. When the nozzle 10 for supplying the thinner, which is supplied each time before the resist solution is coated, and the nozzle 10 for supplying the resist solution, which is supplied after the thinner is supplied, are moved in the above-mentioned sequence to the center of the wafer W, an average moving distance of the base 12 can become the shortest. The coating solution supply mechanism 70, the air-operated valve 72 and the suck-back valve 73 perform a driving operation as well as an opening/closing operation in cooperation with one another, and they are connected with a dispense controller 119 for controlling a pouring amount, a pouring time, a suction amount and a suction time.

Further, as illustrated in FIG. 2, the dispense controller 119 of the supply unit 7 is connected with a controller 9 for controlling operations of the respective devices and the coating unit 1. In addition, the controller also functions to control the entire operation of a coating and developing apparatus including the coating unit 1 in accordance with the present embodiment.

Based on the above-described configuration, an operation of applying the resist solution to the wafer W by the coating unit 1 will be briefly described. The wafer W is loaded into the case 30 by an external transfer unit through one of the three loading/unloading ports 30a and a rear surface of the wafer W is supported by the elevating pin 44. Then, the transfer unit is retreated to the outside of the case 30 and the elevating pin 44 is lowered, so that the wafer W is transferred to the spin chuck 41 of the liquid processing unit 2 (2a, 2b and 2c) corresponding to the loading/unloading port 30a through which the wafer W was loaded.

Subsequently, the nozzle transfer mechanism 10a is operated, so that the nozzle arm 11 held on the nozzle bath 14 in a standby state is lifted up, and then transferred in a Y direction of FIG. 1B. Then, when the nozzle 10 for supplying the thinner reaches a position above the substantially central portion of the wafer W, the nozzle arm 10 is stopped and then lowered at that position. Thereafter, the thinner is supplied from the nozzle 10 onto the stationary wafer W, and then the nozzle arm 11 is moved such that the nozzle 10 for supplying the resist solution to be coated in the process is positioned above the substantially central portion of the wafer W. At the same time, the spin chuck 41 is, for example, rotated at a high speed, and the resist solution is supplied onto the rotating wafer W and then the supply of the resist solution is stopped. Thus, the resist solution is spread in a diametric direction of the wafer W to perform spin coating.

Subsequently, the spin chuck 41 is rotated at a low speed to make a thickness of the spin-coated resist film uniform, and then the spin chuck 41 is rotated at a high speed again to dry the coated resist solution by spin drying. In the meantime, the nozzle transfer mechanism 10a moves the nozzle arm 11 in an opposite direction to the above-mentioned direction, and then the nozzle 10 that completed the supply of the coating solution is held on the nozzle bath 14 in a standby state.

Meanwhile, after completing the spin drying, the corresponding EBR mechanism 6 is operated, so that the rinse nozzle is moved from the EBR nozzle bath 64 to the peripheral portion of the wafer W. Then, the rinse is applied thereto and the spin chuck 41 is rotated, and the resist film coated on the peripheral portion of the wafer W is removed. Thereafter, the rinse is dried by spin drying in the same manner as in the case of the resist solution, and thus a series of liquid processing is completed.

After the rinse nozzle is retreated to the EBR nozzle bath 64, the wafer W coated with the resist film is transferred to the transfer unit in the reverse order of the loading of the wafer W, and the wafer W is unloaded from the coating unit 1. Accordingly, the wafer W is transferred in sequence to each of the liquid processing units 2a, 2b and 2c at an interval of, for example, 24 seconds according to a predetermined wafer transfer cycle for the coating and developing apparatus, and the same processes are performed on the wafer W. Further, after the nozzle 10 pours the coating solution (the thinner and the resist solution) onto the wafer W in the liquid processing unit 2, it is retreated to the nozzle bath 14 positioned, e.g., at one end of the coating unit 1 so as to suppress the drying of the resist solution.

Figure 4A:
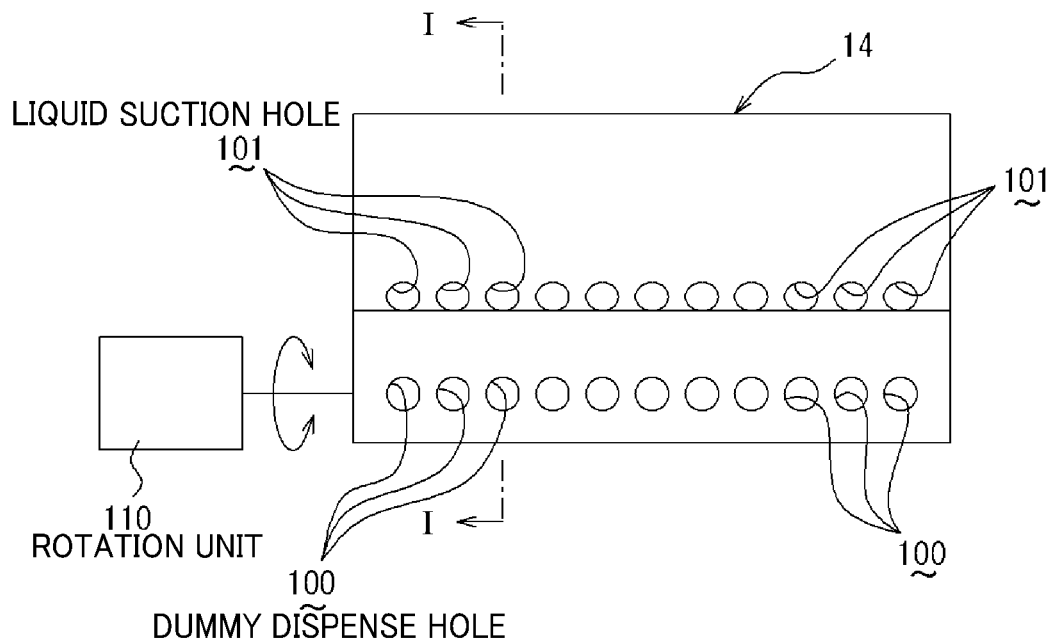
FIG. 4A shows a schematic plane view of a nozzle bath serving as a standby position of the coating nozzles.
Figure 4B:
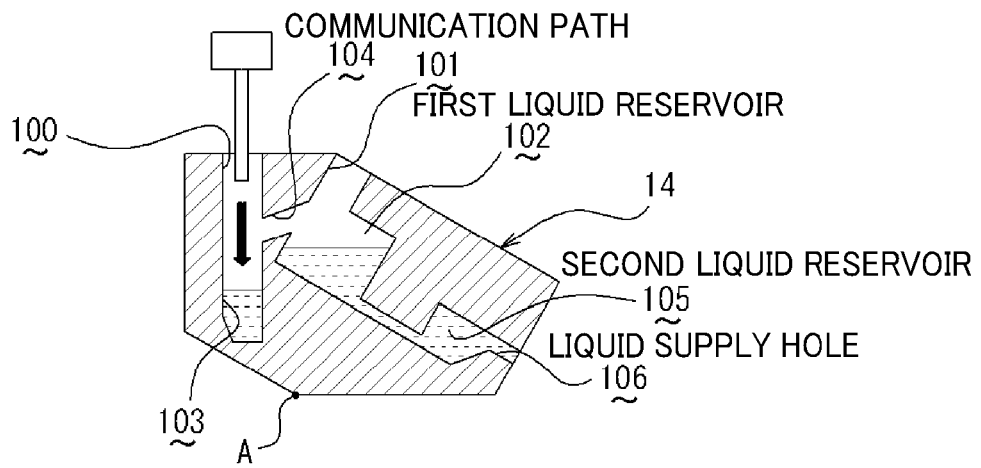
FIG. 4B is a cross-sectional view taken along line I-I of FIG. 4A.
Figure 4C:
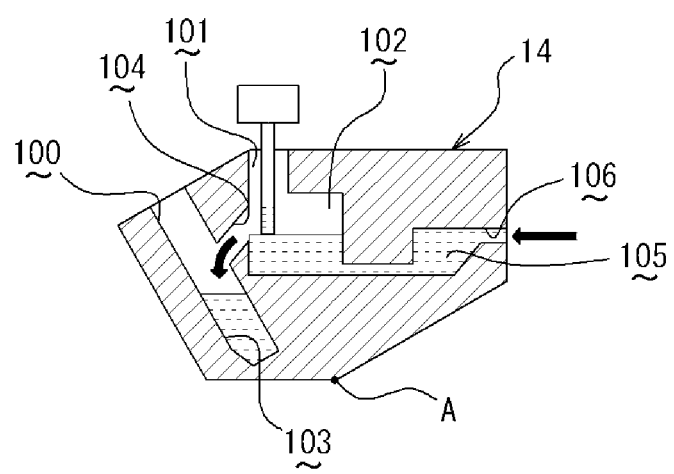
FIG. 4C is another cross-sectional view when a liquid is supplied.

Hereinafter, there will be described a configuration of the nozzle bath 14 in FIG. 1B with reference to FIGS. 4A, 4B and 4C. FIG. 4A is a top view of the nozzle bath 14. The nozzle bath 14 includes a plurality of dummy dispense holes 100 for discharging a liquid during a dummy dispense operation and a plurality of liquid suction holes 101 for sucking, e.g., thinner from the leading end portion of the nozzle in the same shape as the dummy dispense holes 100. Here, the number of the dummy dispense holes 100 corresponds to the number of the leading end portions of the plurality of the nozzles 10 installed in the nozzle transfer mechanism 10a. FIG. 4B is a cross-sectional view (taken along line I-I of FIG. 4A) of the nozzle bath 14 when the nozzle transfer mechanism 10a is lowered facing the plurality of dummy dispense holes 100, and the dummy dispense operation is carried out. A common drain path 103 connected with the plurality of the dummy dispense holes 100 is provided at a lower part of the dummy dispense hole 100 and the resist solution is removed by regularly pouring it from the nozzle so as to reduce the causes of process defects. The removed resist solution passes through the common drain path 103 and is discharged through a non-illustrated waste liquid line.

The nozzle bath 14 is rotated around a point A by the rotation unit 110 at about 45 degrees on a vertical surface orthogonal to a direction of the nozzle arrangement. FIG. 4C is a cross-sectional view of the rotated nozzle bath 14. A plurality of first liquid reservoirs 102 is provided at lower parts of the plurality of liquid suction holes 101, respectively. Installed at the first liquid reservoir 102 are a second liquid reservoir 105 serving as a buffer chamber through a flow path communicating with the first liquid reservoir 102 and a liquid supply hole 106 for supplying, e.g., thinner to the second liquid reservoir 105. The supplied liquid passes through the second liquid reservoir 105 and is gathered in the first liquid reservoir 102. Further, the first liquid reservoir 102 and the common drain path 103 communicate with each other via a communication path 104. When the liquid is supplied to the first liquid reservoir 102, the overflowed liquid flows to the common drain path 103 and the common drain path 103 can be cleaned.

The nozzle 10 can be freely moved up and down. At a standby position, the liquid suction holes 101 and the dummy dispense holes 100 of the nozzle bath 14 are commonly positioned at a lowered position of the nozzle 10 by rotating the nozzle bath 14. When the liquid suction hole 101 faces upward by rotating the nozzle bath 14, the nozzle transfer mechanism 10a is lowered so that the leading end portion of the nozzle 10 is immersed in the first liquid reservoir 102 and a certain amount of the liquid is sucked. With this configuration, a discharging position of the coating nozzle and a sucking position of an anti-drying liquid can be switched without changing a position of the coating nozzle in a horizontal direction.

Figure 5:
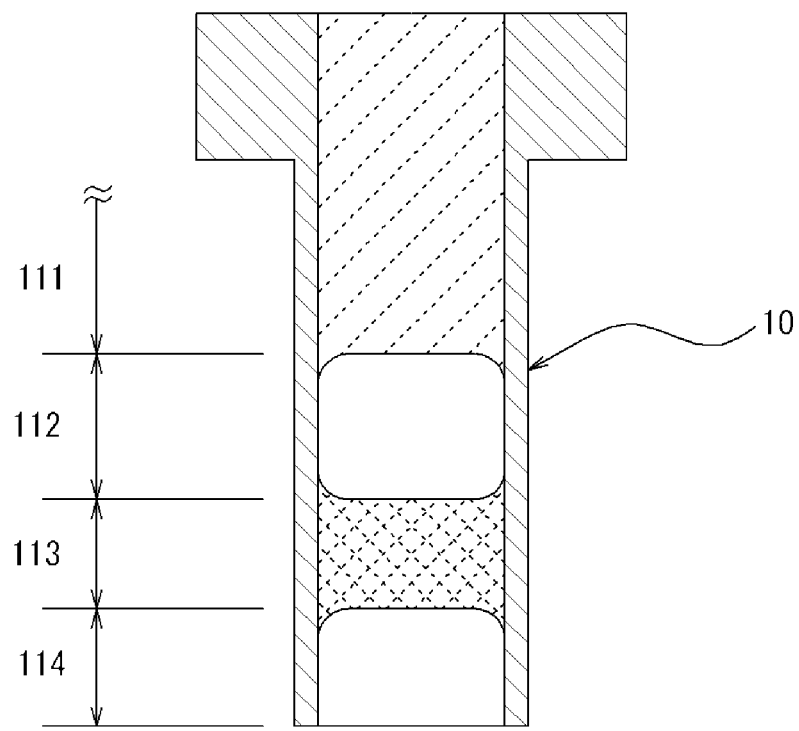
FIG. 5 is a cross-sectional view of a state of a liquid at a leading end portion of the coating nozzle.

The nozzle head 11a and the nozzle 10 of the coating unit 1 configured as stated above in accordance with the present embodiment are optically photographed from, e.g., a position of the nozzle bath 14. In order not to increase the number of times of the dummy dispense operation for preventing drying or contamination of the nozzle 10, a resist solution position 111, a position (width) of an air layer 112, a position (width) of an anti-drying liquid layer 113 and a suck-back width (amount) 114 can be appropriately set in the nozzle 10 by a drying prevention treatment as illustrated in FIG. 5. Detailed functions thereof will be explained hereinafter.

In order to photograph the inside and outside state of the leading end portion of the nozzle 10, the nozzle arm 11 of the nozzle transfer mechanism 10a includes an imaging unit and a prism illumination 200 as illustrated in FIG. 3. The imaging unit captures an image of the nozzle 10 held by the nozzle head 11a from the side by using an image sensor, and the prism illumination 200 uses a prism for providing an LED illumination toward the nozzle 10. For example, a camera 17 such as a CCD camera or a CMOS camera serving as the imaging unit is fixed by a fixing member 18. The camera 17 is configured such that the nozzles 10 are photographed from a direction substantially orthogonal to the arrangement direction of the nozzles 10 held by the nozzle head 11a as illustrated in FIG. 3 in order to photograph the leading end portion of each nozzle 10 without shading each other. Further, the camera 17 includes, for example, a wide-angle lens. The camera 17 is set such that all the leading end portions of the nozzles 10 arranged in a row are within the capturing range and the focus thereof is aligned with each of the leading end portions.

The nozzle 10 is moved to the nozzle bath 14, and the dummy dispense operation is performed and then, as illustrated in FIG. 5, the drying prevention treatment is performed on the nozzle 10 not used in the process. Then, after a predetermined operation time, e.g., 8 hours has passed, the nozzles 10 are photographed by the camera 17 as a whole by providing the prism illumination 200 from the upper side of the nozzle bath 14. Hereinafter, there will be described in detail an optimum method in which there's no necessity of performing the dummy dispense operation for a long period of time for each of the plurality of nozzles 10 based on the image data.

Figure 6A:
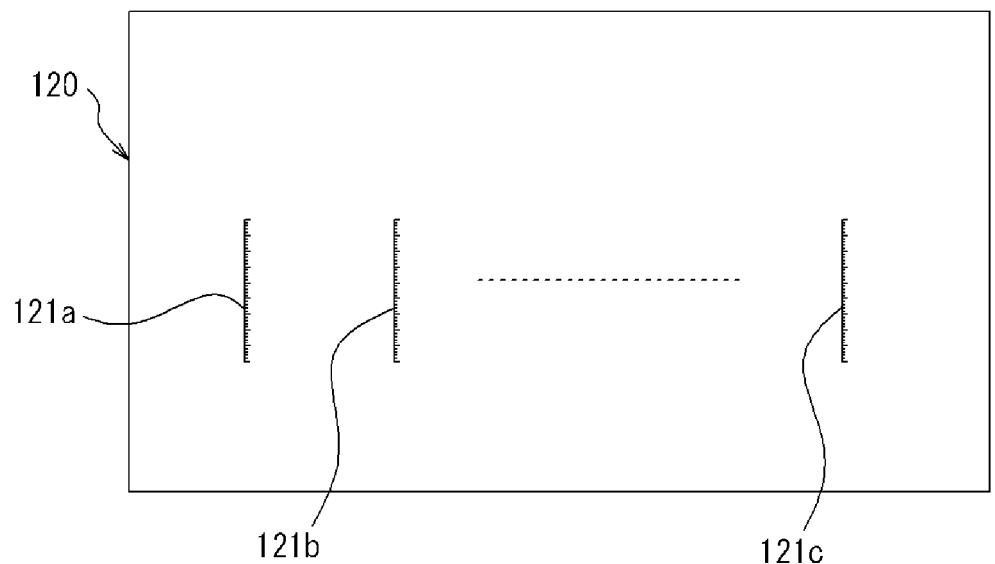
FIG. 6A provides a view showing a soft scale displayed on a monitor screen.
Figure 6B:
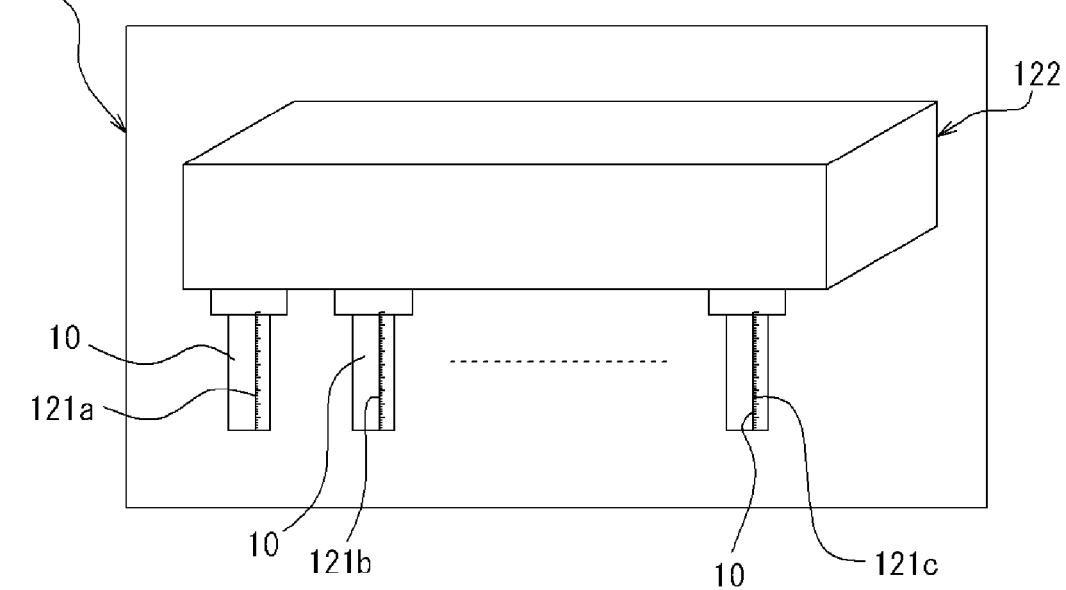
FIG. 6B is a view showing the soft scale and the coating nozzles displayed on the monitor screen.
Figure 6C:
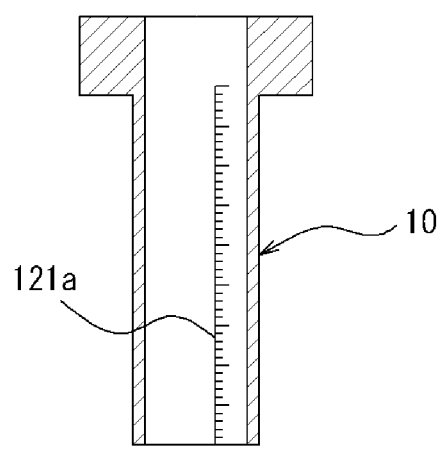
FIG. 6C is an enlarged view showing the soft scale and the coating nozzle displayed on the monitor screen.

The image data of the plurality of nozzles 10 are transmitted to the controller 9. The controller 9 includes therein a determination processing unit 121 which is implemented by a program for executing an analysis process and a determination process on a state of an image-processed coating nozzle. Further, the controller 9 is connected with a display unit 120. The display unit 120 displays various kinds of information or an input of set values for a user, and displays an image of a monitored operation state of the present disclosure based on the instructions of the controller 9. In the display unit 120 displaying the image data outputted from the controller 9, as illustrated in FIGS. 6A to 6C, a plurality of soft scales (graduations) 121a to 121c is displayed to be located at specific positions, e.g., at intervals of 1 mm, and to correspond to a length of the nozzle 10 in the display unit 120 by a software program of the controller 9. The specific positions are based on lengths of the photographed nozzles 10, a distance therebetween and the number thereof. Further, as illustrated in FIGS. 6B and 6C, an image 122 of the actually photographed nozzles 10 is displayed, and the soft scales 121a to 121c set in the screen is overlapped with the image 122 to be displayed together. At this time, the installation position of the camera 17 is finely adjusted by a hardware adjustment such that lower ends of the soft scales 121a to 121c are coincident with the leading ends of the photographed nozzles 10 in the screen, thereby completing the overlap as shown in FIGS. 6B and 6C. Further, in the present disclosure, the controller may directly control the dispense operation. The soft scales does not have to be displayed in pair with the nozzle, but common graduations to the nozzles may be marked on a lateral side of a nozzle display, as long as a length to a leading end of the nozzle is the same with that of the soft scales.

Figure 7:
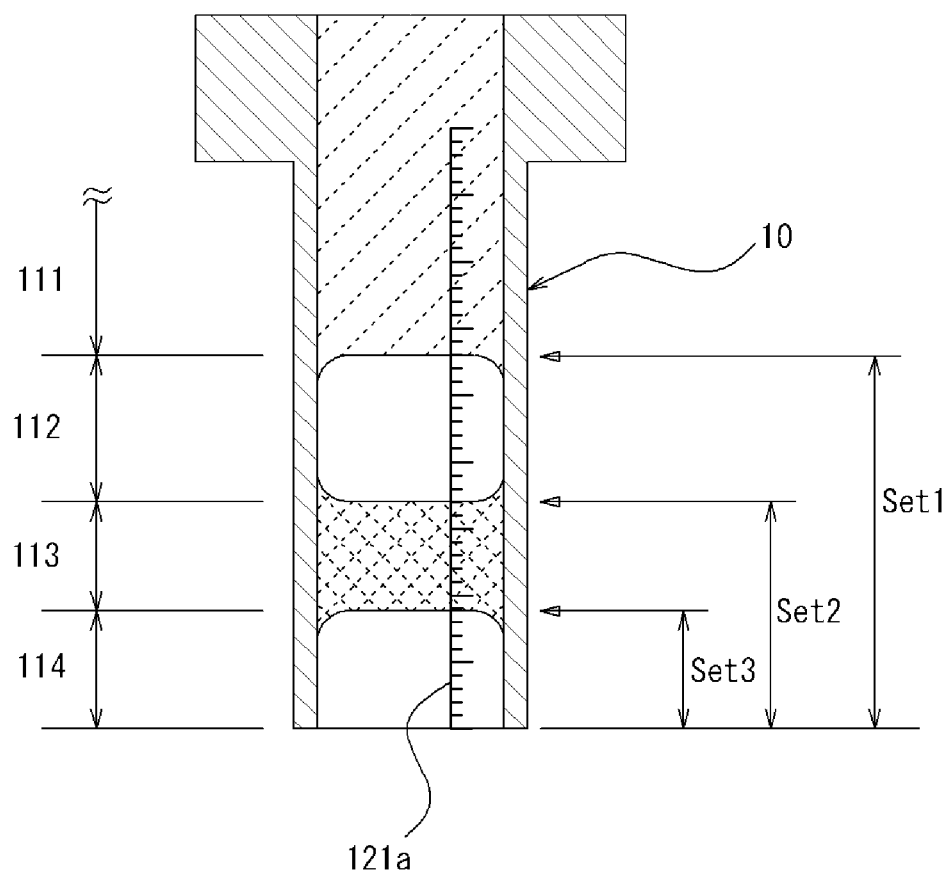
FIG. 7 is an enlarged schematic cross-sectional view of setting a state of the coating nozzle by using the soft scale.

Hereinafter, there will be described a setting method for one nozzle 10 as illustrated in FIG. 7, but the same method can be applied to the other nozzles. Further, same reference numerals in FIGS. 5 and 7 denote same components. First, while the soft scales 121a to 121c (hereinafter, 121a is representatively described) are overlapped with the nozzles 10 in a monitor screen, three settings are carried out such that the inside of the nozzle 10 may not be performed with a dummy dispense operation for a long period of time. Set 1 is a first set height which is a distance from a leading end of the nozzle to a leading end of the resist solution; Set 2 is a second set height which is a distance to an upper end of the anti-drying liquid; and Set 3 is a third set height which is a suck-back width, and they can be set for each of the plurality of nozzles 10. These set-ups are set in the controller 9 and the nozzle transfer mechanism 10a is operated. A control signal is transmitted from the controller 9 to the dispense controller 119 and an operation signal is outputted. The set values are decided based on the graduations of the soft scale 121a, and the dispense controller 119 can be controlled while monitoring an image-processed state. Furthermore, in FIG. 7, reference numeral 111 denotes a resist solution layer, reference numeral 112 denotes an air layer, reference numeral 113 denotes an anti-drying liquid layer, and reference numeral 114 denotes a suck-back width.

Figure 8:
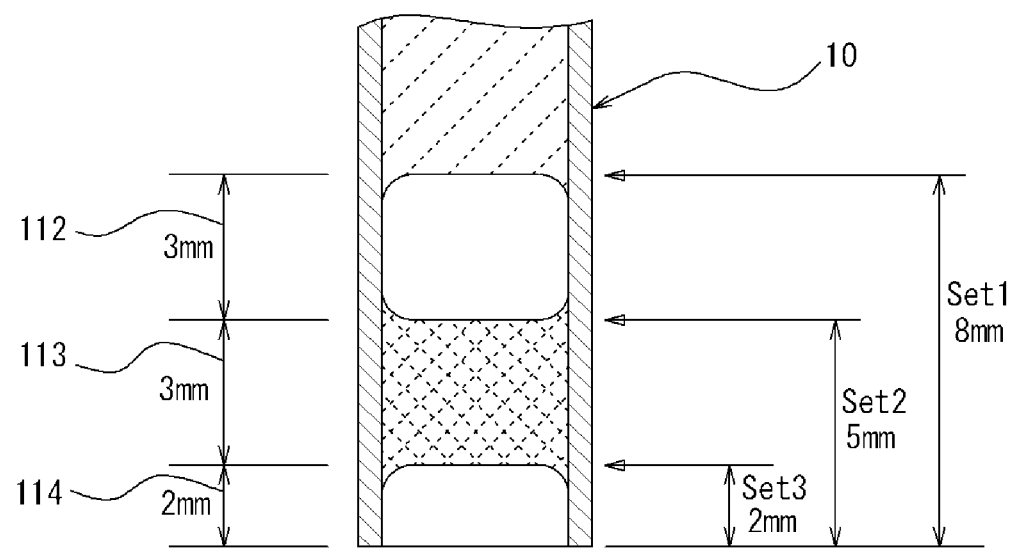
FIG. 8 is an enlarged schematic cross-sectional view showing a set state.

For example, as illustrated in FIG. 8, if the distances from the leading end of the nozzle are set such that Set 1 as the first set value is 8 mm, Set 2 as the second set value is 5 mm, and Set 3 as the third set value is 2 mm, the widths of the air layer 112, the anti-drying liquid layer 113 and the suck-back become 3 mm, 3 mm and 2 mm, respectively, in a complete state.

Hereinafter, a series of operation states in correlation with the states of the leading end of the nozzle, the air-operated valve 72 and the suck-back valve 73 will be explained in sequence in FIGS. 9A to 9I. The nozzle arm 11 is lowered such that the nozzle 10 is inserted into the dummy dispense hole 100 in the nozzle bath 14, and the resist solution is poured for a dummy dispense and the nozzle arm 11 is moved upward (see FIG. 9A). The state at this time is photographed and an image is analyzed, and then a zero position is determined by the determination processing unit 121 (see FIG. 9B). Hereinafter, it is assumed that a signal is outputted from the determination processing unit 121 to determine a set-up operation.

Figure 9A:
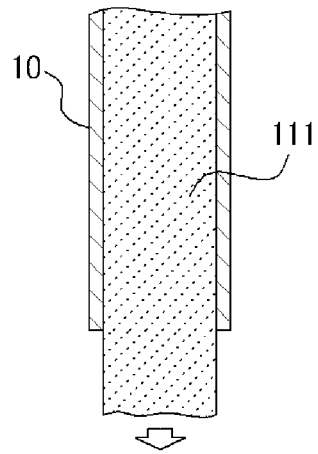
FIGS. 9A to 9I are enlarged schematic cross-sectional views showing states where a dispense control is performed on the coating nozzle.
Figure 9B:
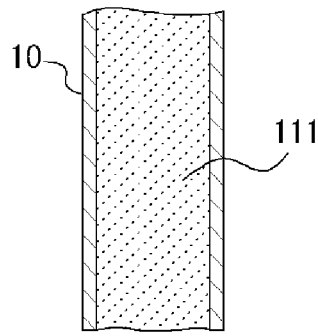
Figure 9C:
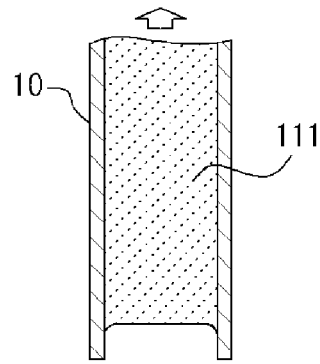
Figure 9D:
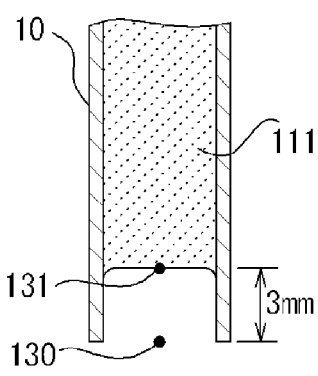

Subsequently, in order to form the air layer 112, the resist is sucked and moved upward by performing the suck-back (see FIG. 9C). This suction state is photographed, and a difference between Set 1 and Set 2 is set to be 3 mm (8 mm−5 mm=3 mm) by the image-processing. That is, the suck-back operation is stopped when a distance between two check points, i.e., a viewpoint 130 serving as a zero reference position of the leading end of the nozzle 10 and a viewpoint 131 serving as a liquid surface position of the resist solution, becomes 3 mm on the soft scale 121a (see FIG. 9D). Then, the nozzle bath 14 is rotated such that the liquid suction hole 101 of the nozzle bath 14 faces in a vertical direction, and at the same time, the liquid is supplied from the liquid supply hole 106. Accordingly, the liquid is newly supplied to the first liquid reservoir 102.

Figure 9E:
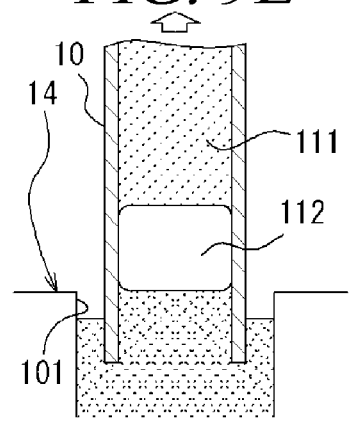
Figure 9F:
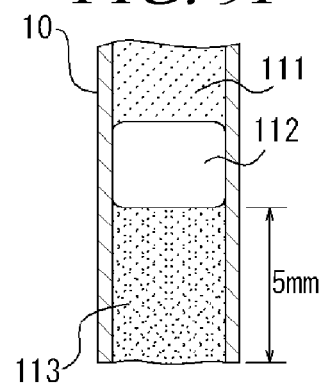
Figure 9G:
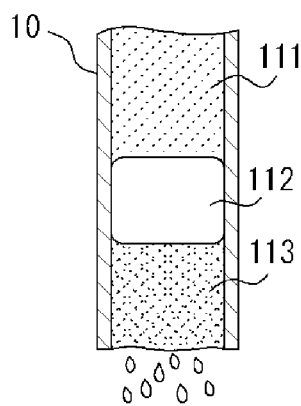

Thereafter, as illustrated in FIG. 9E, the nozzle arm is lowered, so that the nozzle 10 is lowered to a predetermined lower position of the liquid suction hole 101, i.e., to a position where the leading end of the nozzle 10 is immersed into the liquid. Though the liquid is sucked by the suck-back operation, it can not be photographed at this position and the state thereof can not be checked. Therefore, a certain amount, e.g., an amount of about 5 mm on the soft scale is sucked by the suck-back operation (see FIG. 9F).

Then, the nozzle arm 11 is moved upward and the nozzle 10 is photographed. While performing an operation for returning the liquid sucked more than a set value by the suck-back operation, the image processing is performed, so that the liquid is dripped and discharged into the liquid suction hole to be a predetermined amount (see FIG. 9G). At this time, the dispense controller 119 performs a control based on the image processing such that the anti-drying liquid layer is adjusted to be 3 mm aligned with the soft scale, which is a difference between Set 2 and Set 3 (5 mm–2 mm=3 mm) (see FIG. 9H). In this way, the viewpoint 130 serving as the check point is checked by recognizing the viewpoint 131, the viewpoint 132 of a lower end surface of the air layer (an upper liquid surface of the anti-drying liquid), and the view point 130 but it can be checked only by image-recognizing the viewpoints 130 and 132.

Figure 9H:
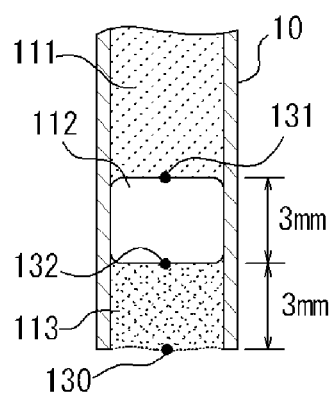
Figure 9I:
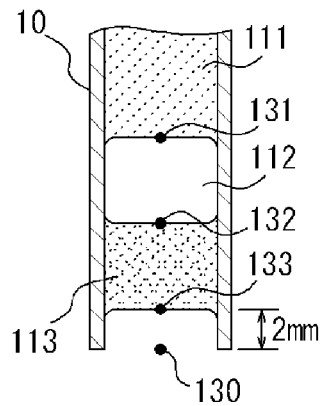

Then, the suck-back operation is performed such that the anti-drying liquid is not leaked out while moving during the process. At this time, the suction operation is performed based on the image processing while photographing the nozzles such that Set 3 becomes 2 mm and a state illustrated in FIG. 9H is changed to a state illustrated in FIG. 9I. Thus, the suction operation is performed such that the soft scale values are aligned with the viewpoints 130, 131 and 132 and a viewpoint 133 of a lower liquid surface of the anti-drying liquid. In this case, it can be performed only by image-recognizing the viewpoints 130 and 133. With this configuration, a set value can be inputted by imaging a complete state of the nozzle in which the anti-drying liquid and the like are located at desired positions based on the soft scale displayed on the screen.

Based on the images photographed during the above-mentioned operations, the dispense control can be performed while checking the images. Accordingly, an optimum standby state of a chemical solution in the plurality of nozzles 10 can be set individually. The standby operation performing the dummy dispense operation is carried out before starting the transfer of the processing lot and the standby operation is started according to a regular set time or a preset number of processed substrates. This operation can be repeated based on a preset value. Particularly, in a standby operation performing a conventional dummy dispense operation, since a suction amount of an anti-drying liquid is not accurately checked, the longest standby time for the nozzle 10 not used in the coating process is set to be short in order to reduce a risk of trouble. However, in the present disclosure, the amount of the air layer or the amount of the anti-drying liquid can be accurately controlled by using the soft scale and performing the adjustment operation depending on a kind or viscosity of the resist. Therefore, the available standby time for the plurality of the nozzles 10 can be accurately checked and the suitable time can be accurately set. Furthermore, since the time taken for the liquid surface to move from the viewpoint 130 to the next viewpoint can be measured, the suction time can be appropriately controlled. With this configuration, the state of the leading end of the nozzle, which was conventionally controlled by the naked eyes of a person in charge of the maintenance of the apparatus, can be controlled with more accuracy, so that the processing liquid can be prevented from being dried over a long period of time.

Accordingly, it is possible to perform an adjustment at a place, where it is difficult to perform the adjustment by the naked eyes, in a short period of time. Therefore, it is possible to suppress a decrease in the process efficiency, which is caused by, e.g., the standby time for the dummy dispense operation, and thus productivity can be improved.

Figure 12:
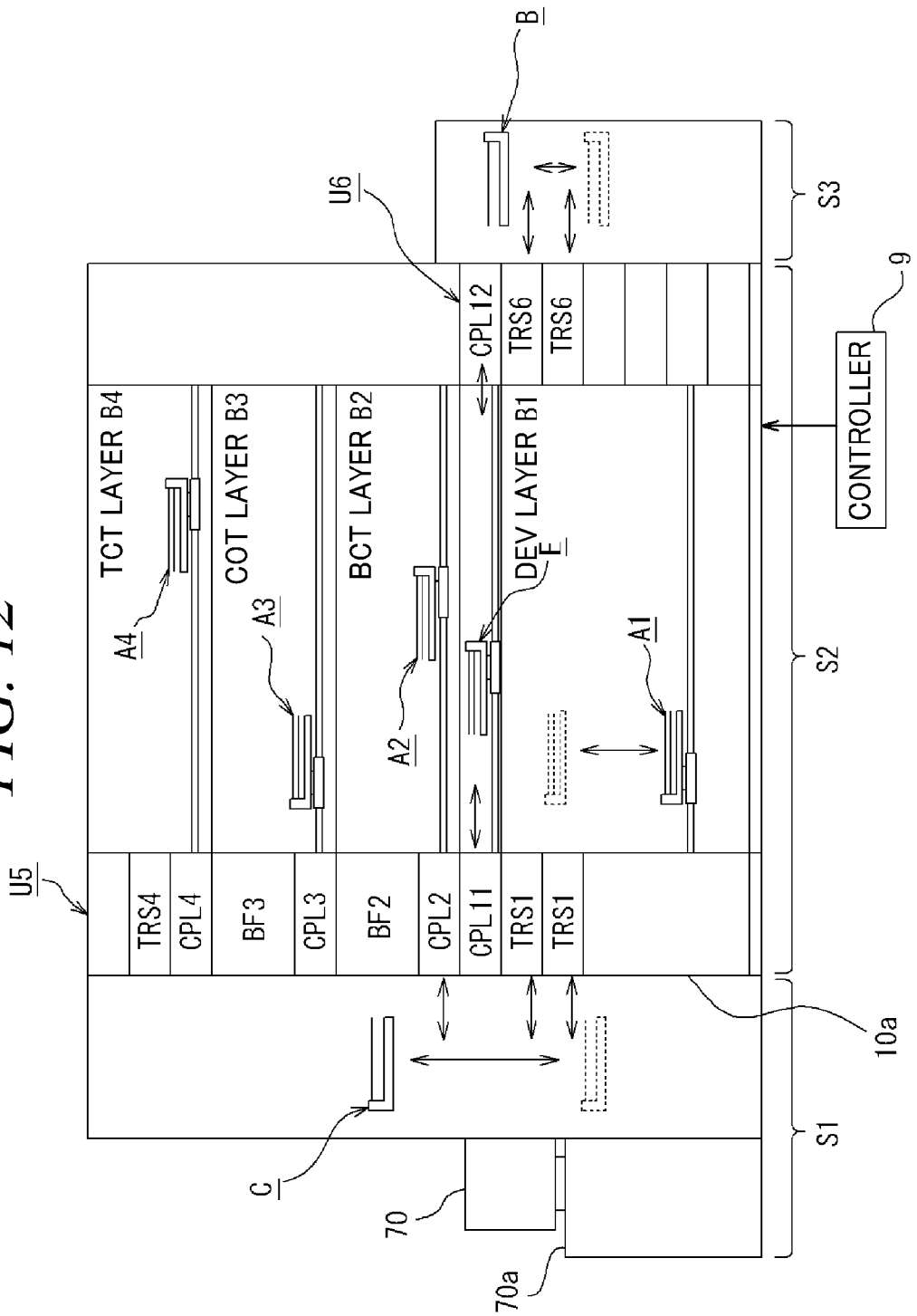
FIG. 12 is a longitudinal cross-sectional view of the coating and developing apparatus.

Hereinafter, an example of a coating and developing apparatus to which the coating unit 1 is applied will be explained in brief. FIG. 10 is a plane view of a system in which a coating and developing apparatus is connected with an exposure apparatus, and FIG. 11 is a perspective view of the system. Further, FIG. 12 is a longitudinal cross-sectional view of the system. A carrier block S1 is installed in the system. An arm C takes out a wafer W from an airtight carrier 80 mounted on a mounting table 80a, and then the arm C transfers the wafer W to a processing block S2. The arm C receives a processed wafer W from the processing block S2, and then the arm C returns it to the carrier 80.

As illustrated in FIG. 11, the processing block S2 in the example includes a first block (DEV layer) B1 for performing a developing process, a second block (BCT layer) B2 for forming an antireflection film under a resist film, a third block (COT layer) B3 for forming the resist film and a fourth block (TCT layer) B4 for forming an antireflection film on the resist film, which are stacked in sequence from the bottom upward.

Each of the second block (BCT layer) B2 and the fourth block (TCT layer) B4 includes the coating unit 1 in accordance with the present disclosure for coating the wafer W with a chemical solution for forming the antireflection film by spin coating; a group of heating•cooling processing units for performing processes before and after the process carried out by the coating unit 1; and carrying arms A2 and A4 installed between the coating unit 1 and the group of processing units, for transferring the wafer W therebetween. The third block (COT layer) B3 has the same configuration except that a resist solution is used instead of the chemical solution.

Meanwhile, as illustrated in FIG. 12, the first block (DEV layer) B1 includes two developing units stacked in two levels. Further, provided in the first block (DEV layer) B1 is a carrying arm A1 for transferring the wafer W to the two developing units. That is, the carrying arm A1 works for both of the two developing units.

As illustrated in FIGS. 10 and 12, the processing block S2 has a shelf unit U5. The wafers W are transferred successively from the carrier block S1 to one transfer unit of the shelf unit U5, e.g., a transfer unit CPL2 corresponding to the second block (BCT layer) B2, by a vertically movable first transfer arm D1 installed in the vicinity of the shelf unit U5. The carrying arm A2 in the second block (BCT layer) B2 receives the wafer W from the transfer unit CPL2 and transfers the wafer W to each unit (the antireflection film unit and the group of heating•cooling processing units). In these units, an antireflection film is formed on the wafer W.

Thereafter, the wafer W is loaded into the third block (COT layer) B3 via a transfer unit BF2 of the shelf unit U5, the transfer arm D1, a transfer unit CPL3 of the shelf unit U5 and a carrying arm A3, and a resist film is formed on the wafer W. Then, the wafer W is transferred to a transfer unit CPL11 of the shelf unit U5 via the carrying arm A3, the transfer unit BF3 of the shelf unit U5 and the transfer arm D1 in sequence. Furthermore, in the fourth block (TCT layer) B4, an antireflection film may be additionally formed on the wafer W on which the resist film has already been formed. In this case, the wafer W is transferred to the carrying arm A4 via a transfer unit CPL4, and after the antireflection film is formed thereon, the wafer W is transferred to a transfer unit TRS4 by the carrying arm A4.

Meanwhile, in an upper part of the DEV layer B1, there is provided a shuttle arm E serving as a dedicated transfer unit for transferring the wafer W from the transfer unit CPL11 of the shelf unit U5 directly to a transfer unit CPL12 of a shelf unit U6. The wafer W coated with the resist film or the additional antireflection film is transferred from the transfer units BF3 and TRS4 to the transfer unit CPL11 via the transfer arm D1. Then, the shuttle arm E transfers the wafer W from the transfer unit CPL11 directly to the transfer unit CPL12 of the shelf unit U6, and then introduced into an interface block S3. In FIG. 12, the transfer units designated by "CPL" also serve as cooling units for temperature control, and the transfer units designated by "BF" also serve as buffer units capable of holing plural sheets of the wafers W.

Subsequently, the wafer W is transferred to an exposure apparatus S4 by an interface arm B. After a predetermined exposure process is performed on the wafer W, the wafer W is mounted on a transfer unit TRS6 of the shelf unit U6 and returned to the processing block S2. In the first block (DEV layer) B1, the developing process is performed on the returned wafer W, and the wafer W is transferred to a transfer stage TRS1 of the shelf unit U5 by the carrying arm A1. Thereafter, the wafer W is transferred to a transfer stage within an access range of the transfer arm C in the shelf unit U5 by the first transfer arm D1, and then returned to the carrier 80 via the transfer arm C. In FIG. 10, each of reference numerals U1 to U4 denotes a group of thermal units in which a heating unit and a cooling unit are stacked.

In accordance with the present disclosure, the nozzle can be maintained in an optimum state, so that the drying of the coating solution in the front end portion of the non-using nozzle can be easily suppressed. Thus, even if different coating solutions need to be prepared because of lot change, it does not take much time for performing the dummy dispense operation. Further, with an accurate control, a set-up for performing the next dummy dispense can be set more accurately, so that it becomes easy to manage the operation state of the apparatus and productivity can be improved. Furthermore, since the photographed images can be checked by the display unit, the state thereof can be checked accurately even by an apparatus operator. Moreover, since the rotation unit for switching the pouring hole of the coating solution and the suction hole of the anti-drying liquid is installed at the nozzle bath, there is no need to install a driving unit at the nozzle transfer mechanism that moves above the substrate to be processed. Therefore, the apparatus does not have a complicated structure and there are no defects caused by particles generated from the driving unit.

What is claimed is:

1. A liquid processing method that forms a coating film by supplying and pouring a coating solution from a coating solution nozzle onto a surface of a substrate held substantially horizontally by a substrate holder, the method comprising:
   moving the coating solution nozzle to a nozzle bath for keeping the coating solution nozzle in a standby state;
   controlling a dispense process including a pouring operation of the coating solution from the coating solution nozzle, a suction operation of the coating solution and an anti-drying liquid for the coating solution, and a discharge operation of the anti-drying liquid;
   analyzing and checking image data of the coating solution nozzle photographed by an imaging unit; and
   displaying the photographed image data of the coating solution nozzle on a soft scale having graduations which are displayed to be overlapped with the image data of the coating solution nozzle photographed by the imaging unit in a vertical direction, and inputting a setting value,
   wherein, analyzing and checking the image data includes:
   making a determination by comparing the setting value set by the graduations of the soft scale in displaying the image data with suction positions of the coating solution and the anti-drying liquid in the coating solution nozzle with reference to the photographed image data of the coating solution nozzle under operation, such that the coating solution and the anti-drying liquid in the coating solution nozzle are positioned at an optimum position, and
   the dispense process is controlled based on the determination to perform an anti-drying adjustment of the coating solution in a leading end portion of the coating solution nozzle.

2. The liquid processing method of claim 1, wherein, in displaying the image data, the setting value are divided into a first set value, a second set value and a third set value,
   the first set value is a distance from a leading end of the coating solution nozzle to a liquid surface of a lower end of the coating solution sucked into the coating solution nozzle,
   the second set value is a distance from the leading end to a liquid surface of an upper end of the anti-drying liquid sucked into the coating solution nozzle, and
   the third set value is a distance from the leading end to a liquid surface of a lower end of the anti-drying liquid sucked into the coating solution nozzle.

3. The liquid processing method of claim 1, wherein controlling a dispense process includes:
   rotating a rotation unit installed at the nozzle bath when the anti-drying liquid is sucked; and
   sucking the anti-drying liquid from an anti-drying liquid reservoir provided in the nozzle bath after rotating from a position of a hole, to which the coating solution in the coating solution nozzle is poured, to a position of a hole from which the anti-drying liquid is sucked.

* * * * *

UNITED STATES PATENT AND TRADEMARK OFFICE
CERTIFICATE OF CORRECTION

PATENT NO. : 8,846,145 B2  
APPLICATION NO. : 13/656861  
DATED : September 30, 2014  
INVENTOR(S) : Michio Kinoshita Page 1 of 1

It is certified that error appears in the above-identified patent and that said Letters Patent is hereby corrected as shown below:

In the Specification

Column 6, line 64, please add -- 72 -- between "valve" and "serving"

Column 7, line 26, please add -- 9 -- between "controller" and "also"

Column 8, line 39, please add -- 10 -- between "nozzle" and "so"

Column 11, line 7, please add -- 11 -- between "arm" and "is"

Signed and Sealed this  
Third Day of March, 2015

Michelle K. Lee  
*Deputy Director of the United States Patent and Trademark Office*